(12) United States Patent
Wei

(10) Patent No.: US 7,648,924 B2
(45) Date of Patent: Jan. 19, 2010

(54) METHOD OF MANUFACTURING SPACER

(75) Inventor: Kuo-Liang Wei, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 111 days.

(21) Appl. No.: 11/694,437

(22) Filed: Mar. 30, 2007

(65) Prior Publication Data

US 2008/0242092 A1 Oct. 2, 2008

(51) Int. Cl.
*H01L 21/31* (2006.01)

(52) U.S. Cl. .................. 438/778; 438/446; 438/595; 438/596; 257/E21.205; 257/E21.626; 257/E21.64; 257/E29.131

(58) Field of Classification Search .............. 438/446, 438/596, 595, 778; 257/E21.205, E21.626, 257/E21.64, E29.131
See application file for complete search history.

(56) References Cited

U.S. PATENT DOCUMENTS

| | | | | |
|---|---|---|---|---|
| 5,879,999 A * | 3/1999 | Park et al. | ............ | 438/304 |
| 6,235,654 B1 * | 5/2001 | Ngo et al. | ............ | 438/792 |
| 6,251,764 B1 * | 6/2001 | Pradeep et al. | ............ | 438/595 |
| 6,294,480 B1 * | 9/2001 | Pradeep et al. | ............ | 438/763 |
| 6,432,784 B1 * | 8/2002 | Yu | ............ | 438/303 |
| 6,518,136 B2 * | 2/2003 | Lee et al. | ............ | 438/303 |
| 6,551,887 B2 * | 4/2003 | Kwon et al. | ............ | 438/305 |
| 6,756,313 B2 * | 6/2004 | Choi et al. | ............ | 438/706 |
| 6,777,299 B1 * | 8/2004 | Chiu et al. | ............ | 438/303 |
| 6,794,303 B2 * | 9/2004 | Haselden et al. | ............ | 438/734 |
| 6,797,559 B2 * | 9/2004 | Lee et al. | ............ | 438/239 |
| 6,846,730 B2 * | 1/2005 | Haselden et al. | ............ | 438/538 |
| 6,913,980 B2 * | 7/2005 | Wu et al. | ............ | 438/301 |
| 7,064,071 B2 * | 6/2006 | Schwan | ............ | 438/696 |
| 7,091,567 B2 * | 8/2006 | Park et al. | ............ | 257/408 |
| 7,179,715 B2 * | 2/2007 | Chiang et al. | ............ | 438/303 |
| 7,393,746 B2 * | 7/2008 | Dyer et al. | ............ | 438/257 |
| 7,495,280 B2 * | 2/2009 | Lo | ............ | 257/314 |
| 2002/0127763 A1 * | 9/2002 | Arafa et al. | ............ | 438/76 |
| 2002/0182795 A1 * | 12/2002 | Bae et al. | ............ | 438/200 |
| 2004/0157457 A1 * | 8/2004 | Xu et al. | ............ | 438/694 |
| 2004/0175955 A1 * | 9/2004 | Haselden et al. | ............ | 438/757 |
| 2005/0014343 A1 * | 1/2005 | Lee et al. | ............ | 438/393 |
| 2005/0048753 A1 * | 3/2005 | Schwan | ............ | 438/595 |
| 2006/0141719 A1 * | 6/2006 | Jung | ............ | 438/299 |
| 2006/0151840 A1 * | 7/2006 | Maekawa | ............ | 257/384 |
| 2006/0216918 A1 * | 9/2006 | Chiang et al. | ............ | 438/595 |
| 2007/0249177 A1 * | 10/2007 | Koemtzopoulos et al. | ... | 438/733 |

* cited by examiner

*Primary Examiner*—Fernando L Toledo
*Assistant Examiner*—Ankush K Singal
(74) *Attorney, Agent, or Firm*—J.C. Patents

(57) ABSTRACT

A method of manufacturing an L-shaped spacer is described. First, a substrate is provided and a protruding structure is formed thereon. Next, a dielectric material is formed on the substrate and covers the stacked structure. Then, the dielectric material on the top of the protruding structure and on portions of the substrate is removed to form an L-shaped spacer.

11 Claims, 4 Drawing Sheets

METHOD OF MANUFACTURING SPACER

BACKGROUND OF THE INVENTION

1. Field of the Invention

The present invention relates to a method of manufacturing a semiconductor structure, and more particularly to a method of manufacturing an L-shaped spacer.

2. Description of Related Art

With the enhancement of the functions of computers and electronic products, the application circuits have become complicated than ever. In consideration of costs and stability, the required density of transistors within the integrated circuit is significantly increased. However, establishment of high-density integrated circuit cannot be achieved by merely reducing the size of components of the integrated circuit, for any alteration in layout of the integrated circuit is restricted by the design rule and the manufacturing standard. Moreover, the physical characteristics of the components should also be taken into account.

Referring to FIG. 1, a metal-semiconductor-transistor (MOS) is taken for an example. The distance between two MOSs 110 and 120 on a substrate 100 is rather close. Spacers 117 and 127 are disposed at respective sidewalls of a gate 115 of the MOS 110 and a gate 125 of the MOS 120. Since the spacers 117 and 127 present an arc shape, the distance between the two MOSs is even closer. Thereby, during a subsequent process of fabricating a contact window 140, it is very likely to cause an undesired filling, bringing about formation of voids 130. Furthermore, since the sidewalls of gates 115 and 125 may have uneven profiles, current leakage is expectable under a high voltage operation, which affects the electrical performance of devices.

SUMMARY OF THE INVENTION

In view of the foregoing, the present invention provides a method of manufacturing a spacer. According to the method, an L-shaped spacer is formed by using a polymer layer as a mask and performing an etching process.

The present invention further provides a method of manufacturing an L-shaped spacer. According to the method, an L-shaped spacer is formed by forming a passivation layer through a dielectric resolution enhancement coating technique and using the passivation layer as a mask.

A method of manufacturing a spacer is described in the present invention. First, a substrate is provided and a protruding structure is formed thereon. Next, a dielectric material is formed on the substrate and covers the protruding structure. Then, the dielectric material on the top of the protruding structure and the dielectric material on portions of the substrate are removed to form an L-shaped spacer.

According to one embodiment of the present invention, the method of removing the dielectric material comprises forming a polymer layer on the substrate and then performing an etching process. The polymer layer having different etching selectivity from the dielectric material. The etching process comprises removing a portion of the polymer layer to form a polymer spacer and using the polymer spacer as a mask to pattern the dielectric material for forming the L-shaped spacer.

According to one embodiment of the present invention, the method of forming the polymer layer includes a dielectric resolution enhancement coating technique.

According to one embodiment of the present invention, the material of the polymer layer includes hydrocarbon fluoride ($C_xH_yF_z$).

According to one embodiment of the present invention, the etching process is a single etching process.

According to one embodiment of the present invention, the etching process is a dry etching process.

According to one embodiment of the present invention, the method of manufacturing the spacer further includes performing the etching process in a high density plasma (HDP) etcher.

According to one embodiment of the present invention, the HDP etcher is a HDP poly etcher.

According to one embodiment of the present invention, a portion of the polymer spacer is removed as patterning the dielectric material.

According to one embodiment of the present invention, the method of manufacturing the spacer further includes removing the rest of the polymer spacer after the spacer is formed.

According to one embodiment of the present invention, the method of removing the rest of the polymer spacer includes a dry strip method and a wet strip method.

According to one embodiment of the present invention, the material of the dielectric material includes silicon oxide, silicon nitride or silicon oxynitride (SiON).

According to one embodiment of the present invention, the protruding structure is a gate structure.

Another method of manufacturing a spacer is further described in the present invention. The method includes first providing a substrate and forming a protruding structure thereon. Next, a dielectric material is formed on the substrate and covers the protruding structure. A passivation layer is then formed on the substrate with use of a dielectric resolution enhancement coating technique. The passivation layer has different etching selectivity from the dielectric material. Next, a portion of the passivation layer is removed and a passivation spacer is formed. Thereafter, the passivation spacer is used as a mask and patterns the dielectric material.

According to one embodiment of the present invention, the passivation layer includes a polymer layer.

According to one embodiment of the present invention, the material of the polymer layer comprises $C_xH_yF_x$.

According to one embodiment of the present invention, removing the portion of the passivation layer and patterning the dielectric material are performed through a single etching process.

According to one embodiment of the present invention, the method of manufacturing the spacer further includes removing the portion of the passivation layer and patterning the dielectric material in a dry etcher.

According to one embodiment of the present invention, the dry etcher includes an HDP etcher.

According to one embodiment of the present invention, the dry etcher is an HDP poly etcher.

According to one embodiment of the present invention, a cross-section of the spacer presents an L-shape.

According to one embodiment of the present invention, a portion of the polymer spacer is removed as patterning the dielectric material.

According to one embodiment of the present invention, the method of manufacturing the spacer further includes removing the rest of the polymer spacer after the spacer is formed.

According to one embodiment of the present invention, the method of removing the rest of the polymer spacer includes a dry strip process and a wet strip process.

According to one embodiment of the present invention, the material of the dielectric material includes silicon oxide, silicon nitride or SiON.

According to one embodiment of the present invention, the protruding structure includes a gate structure.

The dielectric resolution enhancement coating technique provided in the present invention is employed to form one passivation layer on the dielectric material. Through different etching selectivity between the passivation layer and the dielectric material, the L-shaped spacer can be formed in one etching step. The method provides a simple and easy control for the formation of the spacer. According to the thickness of the passivation spacers, various L-shaped spacers with different width can be formed based on different requirements of devices.

In order to make the above and other objects, features and advantages of the present invention more comprehensible, several embodiments accompanied with figures are described in detail below.

DESCRIPTION OF EMBODIMENTS

FIGS. 2A through 2E are cross-sectional views depicting the steps of manufacturing a spacer according to one embodiment of the present invention.

Figure 1:
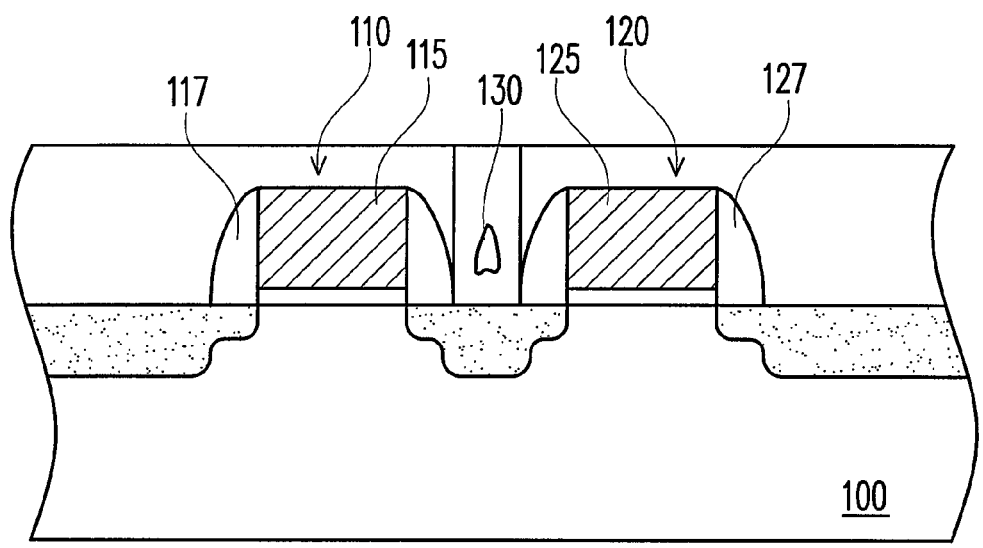
FIG. 1 is a cross-sectional view depicting a structure of a conventional metal-oxide-semiconductor (MOS).
Figure 2A:
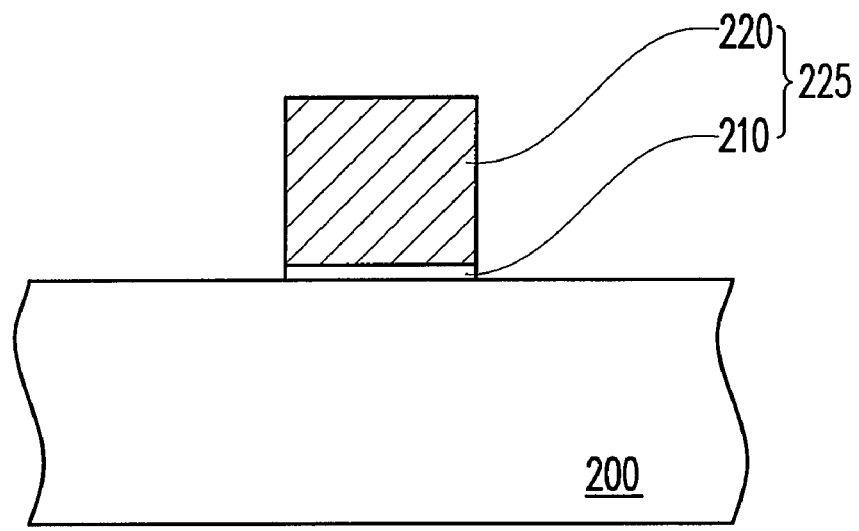
FIGS. 2A through 2E are cross-sectional views depicting the steps of manufacturing a spacer according to one embodiment of the present invention.

First, as shown in FIG. 2A, a substrate 200 is provided, and a protruding structure 225 is formed thereon. The substrate 200 is, for example, a silicon substrate. The protruding structure 225 is, for example, a gate structure having a gate dielectric layer 210 and a gate 220. The material of the gate dielectric layer 210 is, for example, silicon oxide, and the material of the gate 220 is, for example, doped polysilicon.

Figure 2B:
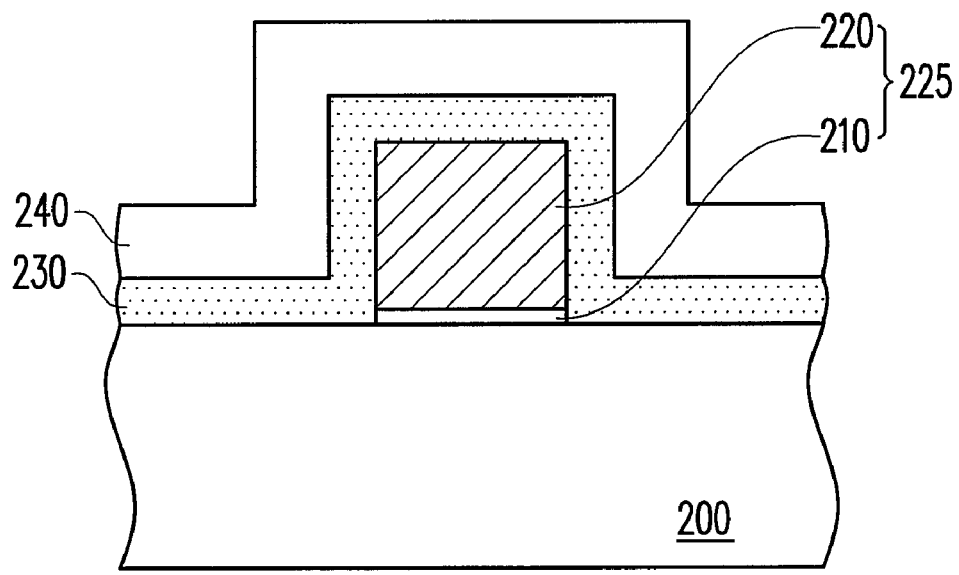

Next, referring to FIG. 2B, a dielectric material, such as a dielectric layer 230, is formed on the substrate 200 and covers the protruding structure 225. The material of the dielectric layer 230 is, for example, silicon oxide, silicon nitride, or silicon oxynitride (SiON). The method of forming the same includes, for example, a chemical vapor deposition (CVD) process. Next, a polymer layer 240 is formed on the substrate 200. The method of forming the polymer layer 240 includes, for example, a dielectric resolution enhancement coating technique. The material of the polymer layer 240 includes hydrocarbon fluoride $C_xH_yF_z$ e.g. trifluoromethane ($CHF_3$), difluoromethane ($CH_2F_2$), carbon fluoride ($C_xF_y$) without hydrogen e.g. octafluorobutene ($C_4F_8$), hexafluoro-ethane ($C_2F_6$), carbons tetrafluoride ($CF_4$), or a combination of $C_xH_yF_z$ and carbon fluoride. The polymer layer 240 is formed by a plasma CVD process, for example. The thickness thereof is determined based on the requirements of the devices.

According to one embodiment, said polymer layer 240 is formed on the dielectric layer 230 by using an LAM 9100 etcher and by performing a recipe for controlling the deposition/etching ratio. Further illustrations regarding the method of forming the polymer layer 240 and related apparatuses are provided in the U.S. patent application Ser. No. 09/978,546 in whole or in part. The content of said patent application is incorporated herein for reference.

Figure 2C:
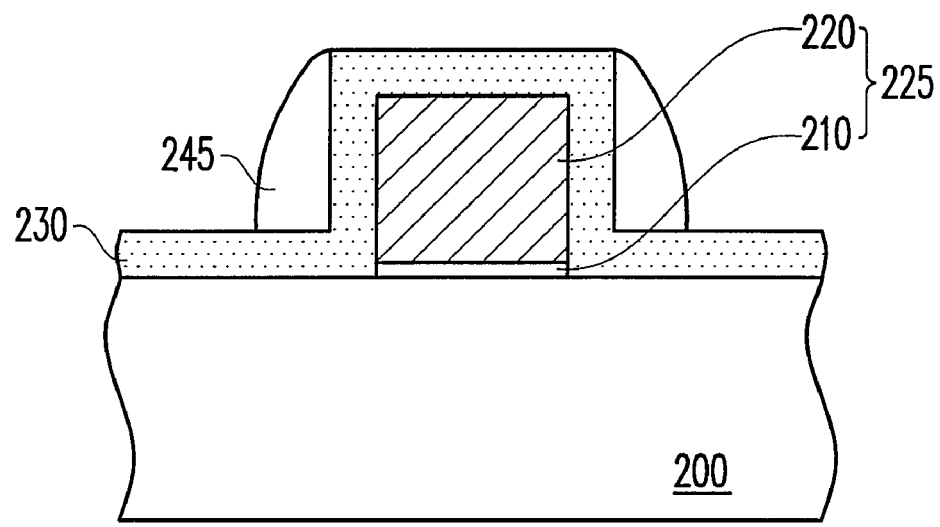
Figure 2D:
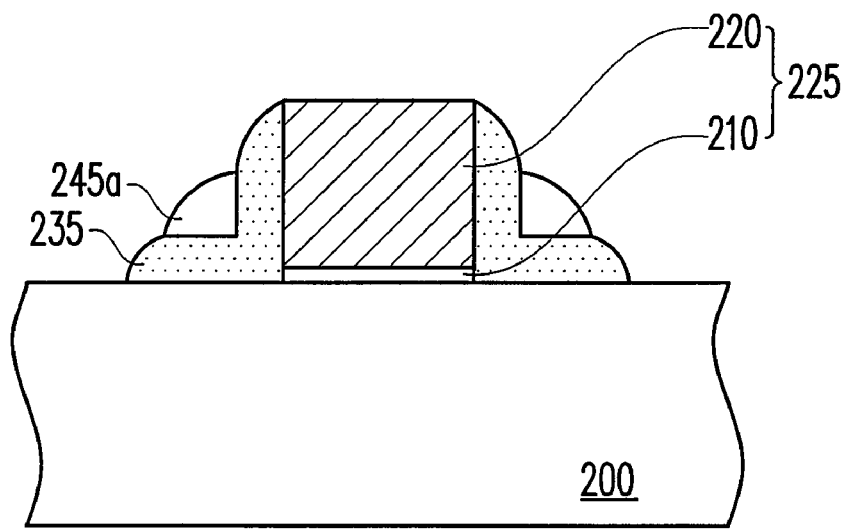

Next, referring to FIG. 2C, a portion of the polymer layer 240 is removed and a polymer spacer 245 is then formed. The method of removing said polymer layer 240 includes, for example, a dry etching process. Thereafter, referring to FIG. 2D, the dielectric layer 230 is patterned to form a spacer 235 by using the polymer spacer 245 as a mask. The method of patterning the dielectric layer 230 includes, for example, the dry etching process, and a cross-section of the formed spacer 235 presents an L-shape.

According to one embodiment, a portion of the polymer layer 240 is removed to form the polymer spacer 245. The dielectric layer 230 is then patterned to form the spacer 235 by using the polymer spacer 245 as a mask. Said steps may be carried out by performing a single etching process.

For example, the steps may be implemented in a high density plasma (HDP) etcher e.g. an HDP poly etcher. Here, the polymer spacer 245 is formed through etching back the polymer layer 240. Next, the etching process is continued. Due to different etching selectivity between the polymer spacer 245 and the dielectric layer 230, the etching speed of the dielectric layer 230 is faster. Accordingly, the polymer spacer 245 can be utilized as a mask to etch the dielectric layer 230, and the L-shaped spacer 235 is further formed. It is certain that a portion of the polymer spacer 245 is removed as well during the process of etching the dielectric layer 230 and a polymer spacer 245a remains.

In other words, the polymer layer 240 is formed by the dielectric resolution enhancement coating technique. Thereby, the single etching process is carried out when the polymer layer 240 and the dielectric layer 230 are both disposed in the etcher, and the L-shaped spacer 235 is easily formed by etching said two layers. According to one embodiment, the single etching process can be implemented throughout under similar circumstances, such as same pressure, same type of gas, and same gas flow, which leads to a significant reduction of manufacturing time and of the manufacturing complexity.

It should be noted that a thicker polymer layer 240 can be deposited on condition that a wider spacer 235 (i.e. the bottom of the L-shaped spacer is longer) is intended to be formed. Namely, the increase in the thickness of the polymer spacer 245a results in the formation of the wider spacer 235 thereunder. Thus, the width of the spacer 235 (i.e. the bottom of the L-shaped spacer) is adjusted based on the thickness of the polymer layer 240, which is conducive to the requirements of designing the devices including high or low voltage devices.

Figure 2E:
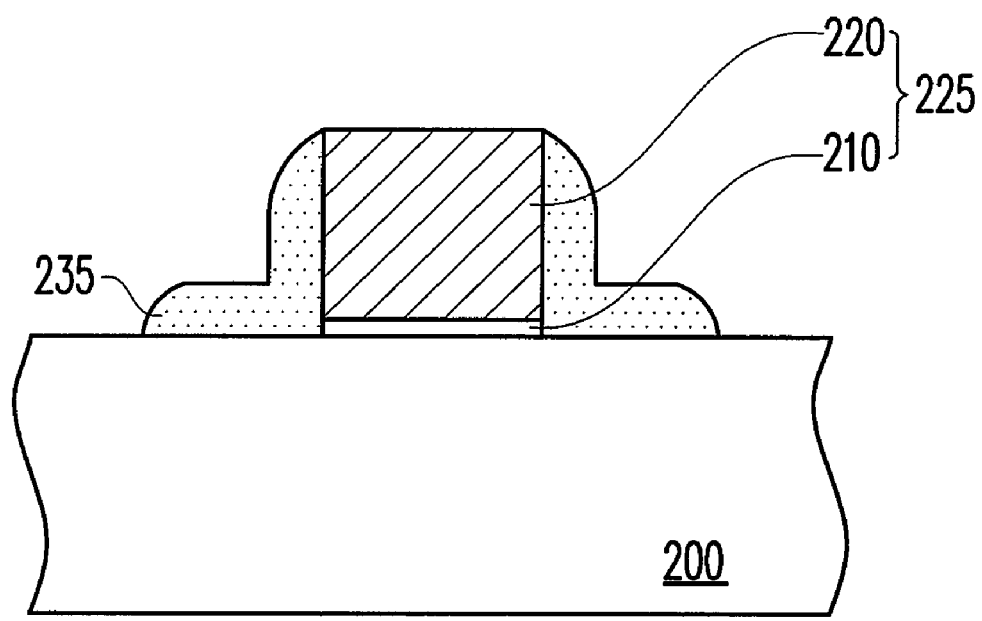

Then, referring to FIG. 2E, the rest of the polymer spacer 245a is removed and the L-shaped spacer 235 disposed at two sides of the protruding structure 225 is left. The method of removing the polymer spacer 245a includes the wet strip process and the dry strip process which is adopted to strip the polymer spacer 245a with use of oxygen plasma, for example. If is certain that the dry etching process may be performed to strip the polymer spacer 245a first, and the wet strip process is implemented to clean the same. In further another embodiment, a dry strip photoresist or a wet strip photoresist may be adopted to remove the polymer spacer 245a.

It is learned from said embodiment that the dielectric resolution enhancement coating technique provided in the present invention is employed to form the polymer layer on the dielectric layer. On account of different etching selectivity between the polymer layer and the dielectric layer, the single etching process can be performed to gradually remove a portion of the polymer layer and the dielectric layer in the same etcher, such that the L-shaped spacer is formed.

The method of manufacturing the spacer is rather simple than complicated. No gas blowing step of feeding a gas into a furnace and no gas pumping step of extracting the gas from the furnace are required. Thereby, without raising or lowering the temperature, the manufacturing process is dramatically simplified, and the accurate control for the width of the spacer can be achieved. Thus, the method of manufacturing the spacer suggested in the present invention can be applied to both the high voltage devices and the low voltage devices. Moreover, the spacer formed by said method is capable of preventing a subsequent formation of voids in the contact window, of avoiding current leakage, and of enhancing the electrical performance of the devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a spacer, comprising:
   providing a substrate having a protruding structure formed thereon;
   forming a dielectric material on the substrate and covering the protruding structure; and
   forming a passivation layer on the substrate, the passivation layer having different etching selectivity from the dielectric material; and
   performing a single etching process, comprising:
      removing a portion of the passivation layer and forming a passivation spacer; and
      using the passivation spacer as a mask and patterning the dielectric material to form the L-shaped spacer, wherein the passivation layer comprises a polymer layer, and the single etching process is implemented throughout under a same pressure.

2. The method of claim 1, wherein the method of forming the polymer layer comprises a dielectric resolution enhancement coating technique.

3. The method of claim 1, wherein the material of the polymer layer comprises hydrocarbon fluoride ($C_xH_yF_z$).

4. The method of claim 1, wherein the etching process is a dry etching process.

5. The method of claim 1, further comprising performing the etching process in a high density plasma (HDP) etcher.

6. The method of claim 1, further comprising removing a portion of the passivation spacer as patterning the dielectric material.

7. The method of claim 1, further comprising removing the rest of the passivation spacer after the spacer is formed.

8. The method of claim 1, wherein the material of the dielectric material comprises silicon oxide, silicon nitride, or silicon oxynitride (SiON).

9. The method of claim 1, wherein the protruding structure comprises a gate structure.

10. The method of claim 5, wherein the HDP etcher is a HDP poly etcher.

11. The method of claim 7, wherein the method of removing the rest of the passivation spacer comprises a dry strip process or a wet strip process.

* * * * *